AUTOMATIC FREQUENCY CONTROL
Filed June 17, 1954
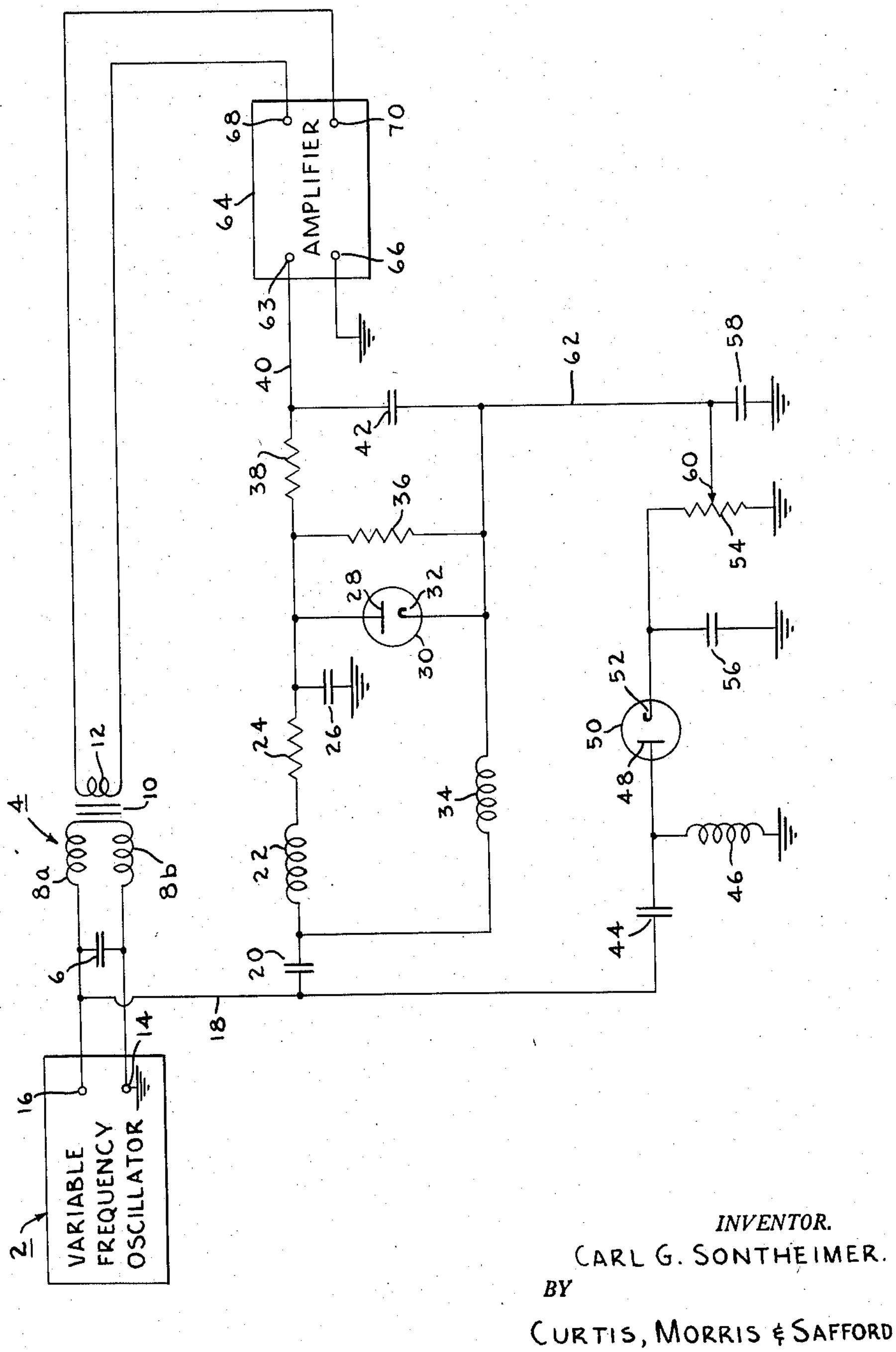
INVENTOR.
CARL G. SONTHEIMER.
BY
CURTIS, MORRIS & SAFFORD
ATTORNEYS.

United States Patent Office 2,880,321

Patented Mar. 31, 1959

2,880,321

AUTOMATIC FREQUENCY CONTROL

Carl G. Sontheimer, Riverside, Conn., assignor to C.G.S. Laboratories, Inc., Stamford, Conn., a corporation of Connecticut Application June 17, 1954, Serial No. 437,521

8 Claims. (Cl. 250—36)

This invention relates to variable-frequency oscillators and particularly to methods and apparatus for stabilizing the operation of variable-frequency oscillators in which the frequency is controlled by an electrically-operated controllable inductor.

In such oscillators, the electrically-controllable inductor forms a portion of a resonant circuit that controls the frequency of the signal generated by the oscillator. Such controllable inductors usually include a closed core of ferrite, or other suitable ferro-magnetic material, which carries a signal winding and a control winding. The extent of magnetic saturation of the core is controlled by varying the current through the control winding. Any change in the magnetic saturation of the core changes the effective inductance of the signal winding, coupled to the same core, and thereby changes the frequency generated by the oscillator. Oscillators controlled in this manner have a large number of applications because such systems permit the frequency of the generated signal to be changed rapidly over relatively wide ranges, and also permit the frequency of the oscillator to be controlled conveniently from remote points because it is not necessary to have any mechanical coupling between the point of control and the oscillator circuit. For example, the controllable inductor may be positioned at the location of the oscillator and the current through the control winding can be varied conveniently from remote locations.

The effective inductance, however, of the signal winding of such controllable inductors is affected not only by the control current through the control winding, but also by other factors such as the temperature of the core and hysteresis. In order to overcome these difficulties, a closed-loop control circuit can be connected to the controllable inductor to maintain the generated frequency at any pre-set value. For example, such a control circuit may include a discriminator arranged to produce a D.-C. voltage which is a stable function of the frequency of the signal generated by the oscillator, and this signal may be utilized to control the inductor in such manner as to eliminate the effects of temperature and hysteresis.

However, the output signal delivered by the discriminator circuit must be substantially independent of changes in amplitude of the oscillator over its operating range in order to obtain the precision control necessary for many applications. One method of accomplishing this is to interpose one or more limiting circuits between the oscillator and the discriminator circuits so that any changes in amplitude of the oscillator are eliminated. In many applications such circuit arrangements are undesirable because they require additional amplification, and because such limiters are not always effective in completely eliminating the changes in amplitude of the oscillator signal. An improved arrangement is described by William D. Gabor in the co-pending U.S. patent application entitled: "Stabilized Oscillator Circuit," Serial No. 429,745, filed on May 14, 1954, and now issued as U.S. Patent No. 2,811,642, dated October 29, 1957, having an assignee common with the present application in which a first D.-C. measuring signal is produced, which is a function of both the amplitude and frequency of the oscillator signal, which is combined in opposition with a D.-C. compensating signal which is a function of the amplitude of the oscillator frequency, so that the resulting signal is a function only of the frequency of the oscillator signal and is substantially independent of its amplitude.

The present invention has certain advantages over the system described by Gabor in the above-identified patent and makes use of both series and parallel detection circuits.

The circuit arrangement incorporating the present invention provides a further improvement in stability, the reasons for which are not fully understood at this time. It may be that a portion of the improvement takes place because less instability is introduced by distortions in the wave form of the signal generator. That is, both the compensating signal, which is a function of the amplitude, and the measuring signal, which is a function of both amplitude and frequency, are derived from the same polarity portion of the signal from the oscillator. That is, the positive portions of the A.-C. signal may be used to generate both the compensating and measuring signals, or the negative portions of the cycles may be used to generate both the control and measuring signals. In any event, this arrangement appears to provide greater stability than circuit arrangements in which the measuring signal is derived from one polarity portion of the oscillator signal and the compensating portion is derived from the opposite polarity portion of the signal.

A more complete understanding of the invention will be had from a consideration of the following detailed description of one embodiment of the invention considered in conjunction with the accompanying drawing which shows a circuit arrangement embodying the invention for controlling the frequency of a variable frequency oscillator.

An oscillator 2 indicated in block form is arranged to generate a variable frequency signal. This oscillator, which may be of any conventional type, includes a parallel resonant circuit 4, formed of a fixed capacitor 6, connected in parallel with a signal winding 8, illustrated in two parts at *8a* and *8b*, of a controllable inductor 10.

The controllable inductor 10 has a control winding 12 and may, for example, be of the type described in the following U.S. patent applications: Saturable Core Apparatus, Gerhard H. Dewitz, Serial Number 283,186, filed April 19, 1952, now Patent No. 2,802,186, dated August 6, 1957; Magnetic Control Device, Gerhard H. Dewitz, Serial Number 300,196, filed July 22, 1952, now Patent No. 2,799,822, dated July 16, 1957; and Magnetic Control Device, Gerhard H. Dewitz, Serial Number 310,341, filed September 18, 1952; all having assignees common with the present application and in the U.S. patent applications referred to therein.

One side of the parallel resonant circuit 4 is connected to a terminal 14 of the oscillator 2 which is connected also to a common ground circuit. The other side of the resonant circuit 4 is connected to an output terminal 16 of the oscillator 2.

In order to produce the measuring signal, the oscillator voltage appearing at terminal 16 is connected by means of a lead 18 through a coupling condenser 20 to one terminal of a fixed inductor 22. The other terminal of the inductor 22 is connected through a fixed resistor 24 and a fixed capacitor 26 to the common ground circuit. The junction of the resistor 24 and the capacitor 26 is connected to the anode 28 of a diode rectifier tube 30, the cathode 32 of which is connected through a fixed inductor 34 to the junction of the coupling capacitor 20 and the fixed inductor 22.

The inductor 22, the resistor 24, and the capacitor 26 form a series discriminator circuit. That is, the voltage which is developed across the capacitor 26 is a function of the frequency of the signal generated by the oscillator 2. The series combination of the inductor 22 and the capacitor 26 is resonant at a frequency just outside the desired operating range of the oscillator 2. In this example, the values of the inductor 22 and capacitor 26 are selected so that the series combination is resonant at a frequency slightly below the lowest frequency to which the oscillator 2 is to be tuned. The inductor 34 provides a direct-current return path for the detector 30.

A load resistor 36 is connected in parallel with the rectifier tube 30 and the voltage appearing across the load resistor 36 is filtered by a resistor-capacitance filter network comprising a resistor 38, connected between the anode 28 of the rectifier 30 and an output lead 40, and a capacitor 42 connected between the output lead 40 and the cathode 32 of the rectifier 30.

In order to produce the compensating signal, which is a function of the amplitude of the signal produced by the oscillator 2, the oscillator signal is coupled from the lead 18 through a coupling capacitor 44 to one terminal of an inductor 46, the other terminal of which is connected to the common ground circuit. The A.-C. coupling network formed by the capacitor 44 and the inductor 46 minimizes amplitude unbalance that might otherwise occur if A.-C. coupling were used for the circuit generating the measuring signal and a direct-coupled circuit were used for generating the compensating signal. Accordingly, A.-C. coupling is used in both portions of the loop and the signal voltage developed across the inductor 46 is substantially independent of the frequency of the oscillator 2 but substantially corresponds to the amplitude of the oscillator signal.

One terminal of the inductor 46 is connected to the anode 48 of a half-wave rectifier 50, the cathode 52 of which is connected through a potentiometer 54 to the common ground circuit. A filter capacitor 56 is connected between the cathode 52 and the common ground circuit. With this arrangement the D.-C. compensating voltage is developed across the potentiometer 54 and is proportional to the amplitude of the oscillator signal. A second filter capacitor 58 is connected between the sliding contact 60 of the potentiometer 54 and the ground.

The signal appearing at the potentiometer contact 60 is combined in opposition with the measuring signal by means of a lead 62 which is connected between the sliding contact 60 and the cathode 32 of the rectifier 30.

With the arrangement shown, it will be seen that the D.-C. measuring signal developed across the resistor 36 will be negative at the upper end of this resistor and positive at its lower end. The compensating signal, however, will be positive at the sliding contact 60 of the potentiometer 54 with respect to the common ground circuit. Accordingly, if these two voltages are equal, zero voltage will appear on the output lead 40 with respect to the common ground circuit.

The lead 40 is connected to an input terminal 63 of a D.-C. amplifier 64, the other input terminal 66 of which is connected to ground. The output terminals 68 and 70 of this D.-C. amplifier are connected to the control winding 12.

The frequency of the signal generated by the oscillator 2 is controlled by adjustment of the sliding contact 60 of the potentiometer 54. For example, if the sliding contact 60 is moved upwardly toward the positive end of the potentiometer, a positive control voltage is applied through the lead 40 to the input of the D.-C. amplifier. The D.-C. amplifier 64 is arranged so that the increase in positive voltage at its input terminal 62 causes a decrease in the output current through the control winding 12. This decrease in current through the control winding 12 decreases the extent of magnetic saturation of the core of the controllable inductor 10 and thereby increases the effective inductance of the signal winding 8, which in turn lowers the frequency of the signal generated by the oscillator 2. The frequency delivered by the oscillator 2 is decreased to a value such that the increased voltage developed across the discriminator capacitor 26 is such as to cause the measuring voltage developed across the load resistor 36 to be substantially equal to the voltage appearing between the sliding contact 60 of the potentiometer 54 and the common ground circuit. This will again reduce the control voltage on the lead 40 to substantially zero value with respect to ground, the exact magnitude of this voltage depending upon the gain provided in the control circuit, that is, the gain provided by the D.-C. amplifier 64.

Suitable D.-C. bias current will be provided for the control winding 12 which in practice is usually selected to set the inductance of winding 8 so that the frequency of the oscillator is about the center of its range. Usually the D.-C. plate current of the final stage of the D.-C. amplifier is arranged to provide this bias current.

It will be readily apparent from what has been said above, considered together with the art already known in this field and the co-pending applications referred to above, that the particular circuit arrangements for carrying out the present invention may take many and varied forms. The circuit will of course be modified and adapted so as to best fit the conditions of each particular use. The particular circuit described above for the purpose of illustrating the principles of operation of the invention is adapted for operation in the general range of the commercial broadcast band, and of course could be modified readily to operate at either higher or lower frequencies.

In the particular example set forth, the capacitor 20 had a value of .01 microfarad; the inductor 22 had a value of 1.7 millihenries; the capacitor 26 had a value of between 10 and 15 micro-microfarads; the load resistor 36 was 820,000 ohms; the filter resistor 38 was 110,000 ohms; the filter capacitor 42 was .01 microfarad.

In the compensating loop, the coupling capacitor 44 had a value of .01 microfarad; the inductor 46 had a value of 2.5 millihenries; the capacitor 56 had a value of .01 microfarad; the value of the potentiometer 54 was 300,000 ohms; and the filter capacitor 58 was .01 microfarad. Conventional half-wave vacuum tube rectifiers can be used as detectors 30 and 50, or suitable semi-conductor diodes can be employed.

From the foregoing it will be seen that a method of controlling the frequency of a variable frequency oscillator has been provided in which a D.-C. measuring signal is derived, the amplitude of which is a function of the frequency of the signal delivered by the oscillator 2 and also a function of the amplitude of alternate half-cycles of the oscillator signal, and which is combined in opposition with a D.-C. compensating signal, the magnitude of which is substantially independent of the oscillator frequency and is a function of the amplitude of the same alternate half-cycles of the oscillator signal from which the measuring signal is derived. The resulting control signal is then utilized to control the frequency generated by the oscillator in such manner as to maintain the measuring and compensating signals substantially equal.

In connection with apparatus for carrying out the foregoing method, it will be seen that I have illustrated an arrangement wherein a series detector circuit is utilized to provide one of the signals and a parallel detector circuit is utilized to provide the other control signal, thereby providing a control system having improved stability and operating characteristics.

I claim:

1. A variable-frequency signal-generating circuit comprising an oscillator having a resonant circuit, a controllable inductor having a signal winding and a control winding and arranged to control the frequency of operation of said oscillator in accordance with the current through said control winding, a frequency discriminator coupled to said resonant circuit of the oscillator and arranged to deliver a signal whose amplitude is a function of the amplitude and frequency of the signal delivered thereto by said oscillator, first detector means coupled to the output of said discriminator, said first detector means having a predetermined direction of conduction and conducting a signal from the output of the discriminator during alternate half-cycles of the signals in the resonant circuit of the oscillator, second magnitude detector means coupled to said resonant circuit of the oscillator, said second detector means having a predetermined direction of conduction and conducting a signal from the resonant circuit of the oscillator during the same alternate half-cycles of the signals in the resonant circuit of the oscillator, a first load resistance connected in series with one of said detector means, a second load resistance connected in parallel with the other of said detector means, circuit means combining in opposition potentials produced across said first and second load resistances to produce a control signal, and means coupling said control signal to the control winding of said controllable inductor.

2. A variable-frequency signal-generating system comprising an oscillator having an output connection, a controllable inductor having a ferrite core with a signal winding and a control winding coupled thereto, a frequency-responsive discriminator coupled to the output of said oscillator and arranged to deliver a signal whose amplitude is a function of the frequency and amplitude of the oscillator signal, a first half-wave rectifier coupled to the output of said discriminator and conducting during alternate half-cycles of the oscillator signal, a first load resistor connected in parallel with said first rectifier, a second half-wave rectifier coupled to said output connector of the oscillator and conducting during the same alternate half-cycles of the oscillator signal, a second load resistor connected in series with said second rectifier, voltage-adjusting means connected with said second load resistor, circuit means connecting the voltage of said first load resistor in series opposition with the voltage from said voltage-adjusting means, a direct current amplifier arranged to amplify the said combined voltages, and circuit means coupling the output of said amplifier to said control winding.

3. A frequency-generating system comprising an oscillator having an output circuit, electrically-operated means for controlling the frequency of said oscillator, frequency discriminator means coupled to the output circuit of said oscillator, first rectifier means coupled to the output of said frequency discriminator and conducting during alternate half-cycles of the oscillator signals, second rectifier means coupled to the output circuit of said oscillator and conducting during the same half-cycles of the oscillator signals, first voltage output means responsive to the rectified signal produced by one of said rectifier means, second voltage output means responsive to the rectified signal produced by the other of said rectifier means, circuit means arranged to produce a control signal whose amplitude is a function of the difference between the voltages delivered by said first and second voltage output means, and means coupling said control signal to said electrically-operated means.

4. In a system wherein a tuned circuit is to be controlled electrically, control apparatus for use with a source of alternating signals of variable frequency and producing a direct current control signal which is a function of the frequency and independent of the amplitude of the alternating signals from said source comprising an input circuit connectible to said source, a frequency-responsive network coupled to said input circuit and arranged to produce a signal whose amplitude is a function of the frequency and amplitude of the signal from said source, first detector means coupled to the output of said frequency responsive network and conducting during predetermined half-waves of the oscillator signal, second amplitude detector means coupled to said input circuit and conducting during the same predetermined half-waves of the oscillator signal, first load circuit means connected with the output of one of said detector means, second load circuit means connected with the output of the other of said detector means, and circuit means combining in opposition potentials produced across at least a portion of each of said first and second load circuits to produce a direct current control signal.

5. A controllable frequency generating system having a high stability in operation comprising a variable frequency oscillator circuit, a frequency control circuit in said oscillator including a controllable inductor having a magnetically saturable core portion, a signal winding coupled to said core portion, said signal winding being coupled to said frequency control circuit, and electromagnetic control means for controlling the saturation of said core portion, said oscillator circuit having an output circuit; a frequency discriminator coupled to said output circuit; first rectifier means coupled to said discriminator, said first rectifier means having a predetermined direction of conduction and conducting during alternate half-cycles of the signals in the oscillator circuit; first filter means coupled to said first rectifier means and having a first voltage developed therewith which is a function of both the frequency and amplitude of the signals from said oscillator output circuit; second rectifier means coupled to said output circuit, said second rectifier means having a predetermined direction of conduction and conducting during the same alternate half-cycles as said first rectifier means; second filter means coupled to said second rectifier means and having a second voltage developed therewith which is a function of the amplitude of the signals from said oscillator output circuit; circuit means combining in opposition at least portions of said first and second voltages and producing a control voltage as a function of said frequency only; and means coupling said control voltage to said electromagnetic control means to control the oscillator frequency.

6. A controllable frequency generating system having high stability in operation comprising an oscillator, electrically-operated means for controlling the frequency of said oscillator, said socillator having an output circuit, a frequency discriminator coupled to said output circuit, first rectifier means coupled to the output of said discriminator and conducting during alternate half-cycles of the oscillator signal, first filter means coupled to said first rectifier means and having a first voltage developed therewith which is a function of both the frequency and amplitude of the signals from said oscillator output circuit, second rectifier means coupled to said oscillator output circuit and conducting during the same alternate half-cycles of the oscillator signal; second filter means coupled to said second rectifier means and having a second voltage developed therewith which is a function of the frequency of the signals from said oscillator output circuit, circuit means combining in opposition at least a portion of said first and second voltages and producing a control signal as a function of said frequency only, and means coupling said control signal to said electrically-operated means for controlling the frequency of said oscillator.

7. A variable-frequency signal-generating circuit comprising an oscillator having an output circuit, a controllable element coupled to said oscillator and having control means and arranged to control the frequency of operation of said oscillator, a frequency discriminator coupled to the output circuit of said oscillator, first detector means coupled to the output of said discriminator and conducting during predetermined alternate half-cycles of the alternating signal generated by said oscillator, a first circuit coupled to said first detector means and developing a first voltage as a function of the frequency of the alternating signal generated by said oscillator and as a function of the amplitude of said half-cycles, second amplitude detector means coupled to the output circuit of said oscillator and conducting during the same half-cycles as said first detector means, a second circuit coupled to said second detector means and developing a second voltage as a function of the amplitude of said half-cycles, a third circuit coupled to said first and second circuits and combining said voltages and producing a control signal as a function of the difference therebetween, said third circuit being coupled to said control means.

8. A controllable frequency generating system having high stability in operation comprising an oscillator, electrically-operated means for controlling the frequency of said oscillator, said oscillator having an output circuit, a first coupling capacitor connected to said output circuit, a series discriminator circuit including an inductor and a capacitor in serial relationship, said series discriminator circuit being connected to said first coupling capacitor, first rectifier means coupled to the output of said series discriminator and conducting during alternate half-cycles of the oscillator signal, first filter means coupled to said first rectifier means and having a first voltage developed therewith which is a function of both the frequency and amplitude of the signals from said oscillator output circuit, a second coupling capacitor connected to said output circuit, second rectifier means being connected to said second coupling capacitor and conducting during the same alternate half-cycles of the oscillator signal, second filter means coupled to said second rectifier means and having a second voltage developed therewith which is a function of the frequency of the signals from said oscillator output circuit, circuit means combining in opposition at least a portion of said first and second voltages and producing a control signal as a function of said frequency only, and means coupling said control signal to said electrically-operated means for controlling the frequency of said oscillator.

References Cited in the file of this patent

UNITED STATES PATENTS

| | | |
|---|---|---|
| 2,255,915 | Kekramolin | Sept. 16, 1941 |
| 2,262,945 | Kircher | Nov. 18, 1941 |
| 2,510,095 | Frankel | June 6, 1950 |
| 2,811,642 | Gabor | Oct. 29, 1957 |